(12) United States Patent
Cohen et al.

(10) Patent No.: US 6,168,855 B1
(45) Date of Patent: *Jan. 2, 2001

(54) POLYOLEFIN COMPOSITES FOR PRINTED CIRCUIT BOARD AND ANTENNA BASE MATERIAL

(75) Inventors: Yachin Cohen, Haifa; Dmitry Rein, Nesher; Lev Vaykhansky, Haifa, all of (IL)

(73) Assignee: Polyeitan Composites Ltd., Haifa (IL)

( * ) Notice: Under 35 U.S.C. 154(b), the term of this patent shall be extended for 0 days.

This patent is subject to a terminal disclaimer.

(21) Appl. No.: 09/418,443

(22) Filed: Oct. 15, 1999

Related U.S. Application Data

(63) Continuation-in-part of application No. 08/980,770, filed on Dec. 1, 1997, now Pat. No. 5,972,484.

(51) Int. Cl.⁷ ...................................................... B32B 3/00
(52) U.S. Cl. ...................... 428/209; 428/297; 428/297.7; 428/298.1; 428/458; 428/901; 428/174; 428/254; 428/258; 428/442; 428/232; 428/378
(58) Field of Search ................................. 428/209, 297, 428/297.7, 298.1, 458, 901; 174/255, 250, 258, 254; 442/232, 378

(56) References Cited

U.S. PATENT DOCUMENTS

| | | | |
|---|---|---|---|
| 4,501,856 | 2/1985 | Harpell et al. | 525/240 |
| 4,543,286 | 9/1985 | Harpell et al. | 428/288 |
| 4,563,392 | 1/1986 | Harpell et al. | 428/394 |
| 4,755,911 | 7/1988 | Suzuki | 361/414 |
| 4,772,509 | 9/1988 | Komada et al. | 428/251 |
| 4,937,585 | 6/1990 | Shoemaker | 343/700 MS |
| 4,944,974 | 7/1990 | Zachariades | 428/36.1 |
| 5,030,402 | 7/1991 | Zachariades | 264/138 |
| 5,093,158 | 3/1992 | Li et al. | 427/278 |
| 5,141,800 | 8/1992 | Effenberger et al. | 428/267 |
| 5,160,472 | 11/1992 | Zachariades | 264/136 |
| 5,175,040 | 12/1992 | Harpell et al. | 428/113 |
| 5,198,281 | 3/1993 | Muzzy et al. | 428/102 |
| 5,230,854 | 7/1993 | Izod et al. | 264/203 |
| 5,573,824 | 11/1996 | Klocek et al. | 428/38 |
| 5,965,245 | * 10/1999 | Okano et al. | 428/209 |

FOREIGN PATENT DOCUMENTS

| | | |
|---|---|---|
| 091 547 A1 | 2/1983 | (EP). |
| 116 845 A2 | 1/1984 | (EP). |
| 313 915 A1 | 12/1988 | (EP). |
| 551 837 A1 | 1/1993 | (EP). |
| 95/06148 | 8/1994 | (WO). |
| 97/11037 | 9/1996 | (WO). |

OTHER PUBLICATIONS

Cordova et al, "A Review of Ultra High Modulus Polyethylene Fiber Reinforced Composites for Electromagnetic Window Applications", *Proc. Int'l SAMFE Symposium* (Feb. 9–12, 1992), pp. 1406–1420.

* cited by examiner

*Primary Examiner*—Cathy F. Lam
(74) *Attorney, Agent, or Firm*—Mark M. Friedman

(57) ABSTRACT

A polyolefin composite for a printed circuit board or antenna base material, a base material including the composite and electronic modules including the base material. The base material includes at least one dielectric layer including a polyolefin composite and at least one electroconductive layer including an electroconductive material, the dielectric and electroconductive layers being intimately bonded to one another.

16 Claims, 1 Drawing Sheet

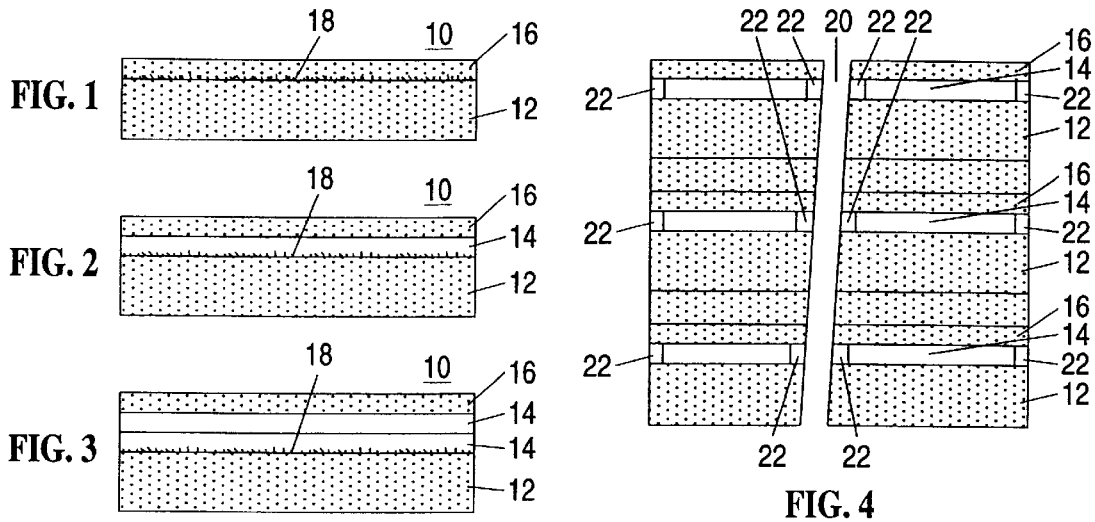
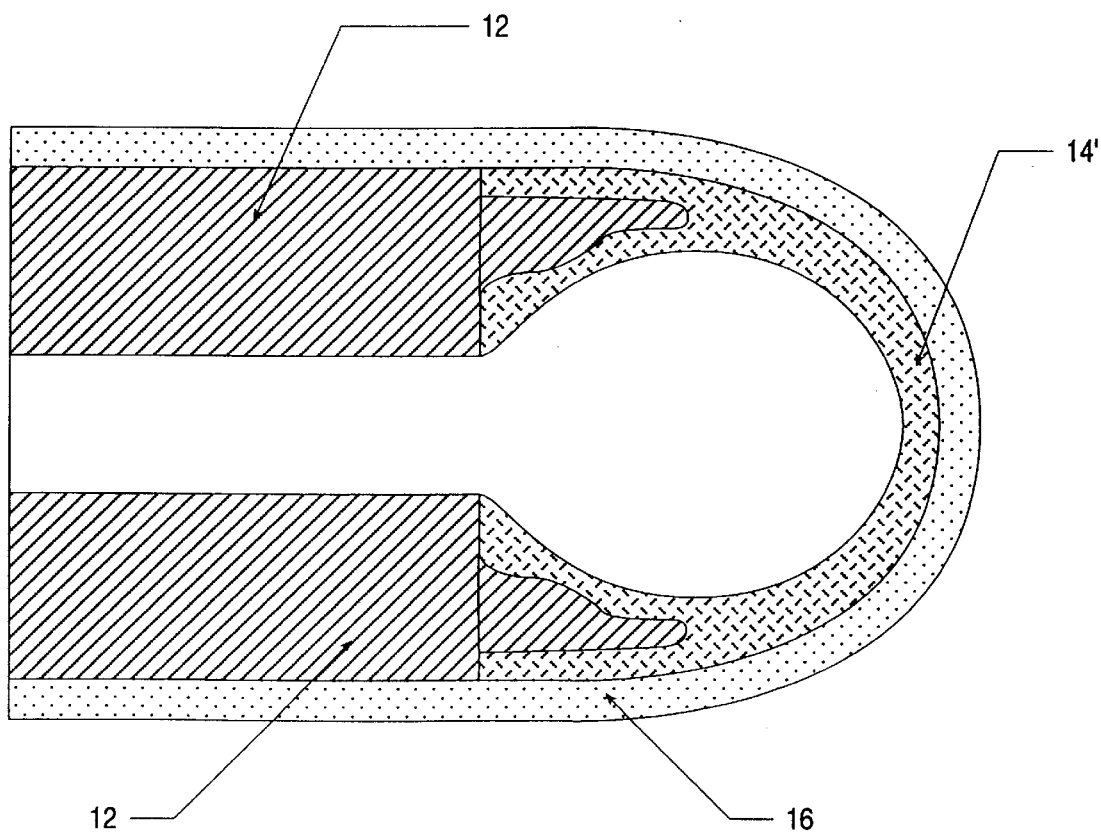

POLYOLEFIN COMPOSITES FOR PRINTED CIRCUIT BOARD AND ANTENNA BASE MATERIAL

This is a continuation-in-part of U.S. patent application Ser. No. 08/980,770 filed Dec. 1, 1997, now U.S. Pat. No. 5,972,484.

FIELD AND BACKGROUND OF THE INVENTION

The present invention relates to polyolefin composites for use as a base material in printed circuit boards (PCBs), antennas and the like, to a base material including the composite and further to electronic modules, such as PCBs, antennas and the like, including the base material. More particularly, the present invention relates to an ultrahigh molecular weight polyethylene (UHMWPE) composite for use as a dielectric in PCBs, antennas and the like. The composites of the present invention are characterized by low dielectric constant and dissipation factor and therefore enable transmission of high frequency electromagnetic signals with short signal transmission delay times, and possess desired mechanical properties, such as rigidity and/or flexibility.

A base material for the production of PCBs, antennas and the like, includes a single or a plurality of dielectric layers and electroconductive layers glued, bonded or otherwise intimately attached to one another. The dielectric layer(s) provide the required mechanical and dielectric properties to support the functionality of the electroconductive layer(s) in the final product (PCB, antenna and the like).

If high frequency electromagnetic signals with short signal transmission delay times are to be transmitted via the electroconductive layer in the final product, the dielectric layer should be provided with a combination of low dielectric constant ($\epsilon$) and low dissipation factor (tan $\delta$).

Additional properties of the dielectric layer preferably include superior mechanical properties, excellent environmental resistance, which is important because tan $\delta$ is very sensitive to water tracks that may be present in the dielectric layer, and good adhesion performances to facilitate effective bonding between the dielectric and electroconductive layers.

It is also desirable to achieve a base material in which the thermal expansion coefficient is comparable to that of the conducting or semiconducting material attached to it.

Dielectric materials presently used to support high frequency electromagnetic signals in PCBs, antennas and the like are polytetrafluorene (PTFE) [$\epsilon$=2.2; tan $\delta$=0.0002], quartz fibers [$\epsilon$=3.78, tan $\delta$=0.0002] and ceramics with low dielectric constant and dissipation factor.

Some of these materials also exist as foam substrates showing even lower dielectric constants.

Different techniques of attaching these materials to an electroconductive layer are also known.

For further detail the reader is referred to U.S. Pat. Nos. 4,772,507; 4,775,911; and 5,141,800, which describe the use of PTFE as a base material for PCBs.

The production, properties and present use of ultra high molecular weight polyethylene (UHMWPE) substrates (e.g., fibers, matrix resin) are described in IL 115229; PCT/IL96/00095 and in a review published in the proceedings of the International SAMPE Symposium (Feb. 9–12, 1992) on pages 1406–1420. These references are hereby incorporated by reference as if fully set forth herein.

UHMWPE has a low dielectric constant and a low dissipation factor [$\epsilon$=2.2; tan $\delta$=0.0002] and possesses good mechanical properties, and may therefore support transmission of electromagnetic signals at high frequencies with short signal transmission delay times.

Although the use of conventional, low molecular weight foamed polyethylene [$\epsilon$=1.3, tan $\delta$=0.001] in microwave circuit modules was described (U.S. Pat. No. 4,937,585), the prior art fails to teach the use of UHMWPE composite as a base material for PCBs and antennas.

There is thus a widely recognized need for, and it would be highly advantageous to have, an ultrahigh molecular weight polyethylene composite for use in a base material for the production of printed circuit boards or antennas, a base material including the composite and electronic modules, such as PCBs, antennas and the like, including the base material, all enjoy the electrical and physical properties of the ultrahigh molecular weight polyethylene composite as further detailed below.

SUMMARY OF THE INVENTION

According to the present invention there are provided an ultrahigh molecular weight polyethylene composite for use in a base material for printed circuit board, antenna and the like, a base material including the composite and electronic modules including the base material.

As used herein in the specification and claims section below, the phrase "ultrahigh molecular weight" refers to an average molecular weight of above 500,000, preferably between 500,000 and 10,000,000, more preferably between 1,000,000 and 8,000,000, most preferably between 2,000,000 and 5,000,000. "Regular" or "common" polyolefins refer to an average molecular weight of below 1,000,000 and usually below 500,000.

As used herein in the specification and claims section below, the phrase "polyolefin" or "polyolefin polymer" refers to polyolefins produced from one or more species of olefin monomers as well as polyolefin copolymers produced from polyolefin and non-polyolefin monomers.

As used herein in the specification and claims section below, the word "oriented" refers to the alignment/direction of individual molecules and/or crystallites from which fibers, whiskers, monofilaments, and the like are formed; "ordered" refers to the orientation of groups of such particles (fibers, whiskers, etc.) on the macroscopic level.

An exception to the above is the term "oriented reinforcement component", a commonly-used term, which, as used herein in the specification and claims section below, refers to a material such as fibers, whiskers, monofilaments, and the like, possessing an oriented molecular and/or crystallite structure.

As used herein in the specification and claims section below, the word "region" refers to a continuous segment of a space (volume) or surface.

According to further features in preferred embodiments of the invention described below, the base material comprising at least one dielectric layer including an ultrahigh molecular weight polyethylene composite and at least one electroconductive layer including an electroconductive material, the dielectric and electroconductive layers being intimately bonded to one another.

According to still further features in the described preferred embodiments the composite includes ultrahigh molecular weight polyethylene fibers, the fibers are held together.

According to still further features in the described preferred embodiments the composite further includes an ultrahigh molecular weight polyethylene matrix for effecting holding the fibers together.

According to still further features in the described preferred embodiments the ultrahigh molecular weight polyethylene fibers are in a form selected from the group consisting of a network of randomly arranged fibers, a unidirectional layer of fibers and a layer of fibers cloth.

According to still further features in the described preferred embodiments the fibers are held together via self bonding.

According to still further features in the described preferred embodiments the matrix is formed from a substance selected from the group consisting of an ultrahigh molecular weight polyethylene powder, an ultrahigh molecular weight polyethylene gel, an ultrahigh molecular weight polyethylene mat, and via recrystallization of partly dissolved ultrahigh molecular weight polyethylene fibers of the composite.

According to still further features in the described preferred embodiments the electroconductive material is selected from the group consisting of a copper foil, a silver foil, a gold foil and an electroconductive polymer sheet.

According to still further features in the described preferred embodiments, a surface of each of the dielectric layers, the surface facing one of the conductive layers, includes exposed free ends of broken ultrahigh molecular weight polyethylene fibrils. This is preferably effected by abrasion treatment applied to the surface.

According to still further features in the described preferred embodiments the dielectric layers and the electroconductive layers are bonded together by a polar glue.

According to still further features in the described preferred embodiments the thermal expansion capability substantially equals zero. As used herein, the term thermal expansion capability refers to thermal expansion of the composite under temperatures in the range of −80° C. to +80° C., whereas substantially means ± about 0.5%, preferably ± about 0.4%, more preferably ± about 0.3%, most preferably ± about 0.2%, ideally ± about 0.1%, ultimately ± about 0.01 or about 0.0%.

According to still further features in the described preferred embodiments the base material features both rigid and flexible regions.

According to still further in the described preferred embodiments the base matrices are acquired a predetermined rigidity.

According to further features in preferred embodiments of the invention described below, provided is a multilayer printed circuit board base material comprising several of the printed circuit board base materials described above, adhered to one another, preferably via ultrahigh molecular weight polyethylene layers positioned between adjacent boards.

The present invention successfully addresses the shortcomings of the presently known configurations by providing an ultrahigh molecular weight polyethylene composite for use as a base material in printed circuit boards, antennas and the like, a base material including the composite and electronic modules including the base material, which enjoy the electrical and physical properties of the ultrahigh molecular weight polyethylene composite, as further detailed below.

It has also been discovered that other oriented and/or non-oriented polyolefin materials can replace, fully or partially, ultrahigh molecular weight polyethylene oriented and/or non-oriented materials. Although the mechanical properties are less good, the strength characteristics are sufficient for many microwave applications, and the cost of such materials is as little as 20–50% of ultrahigh molecular weight polyethylene materials.

Hence, further provided is a printed circuit board or antenna base material which includes at least one dielectric layer including a composite which includes regular molecular weight polyolefins, and at least one electroconductive layer including an electroconductive material said dielectric and electroconductive layers being intimately bonded to one another. In a preferred embodiment, the polyolefin is selected from the group consisting of high-density polyethylene, low-density polyethylene, and combinations thereof.

BRIEF DESCRIPTION OF THE DRAWINGS

The invention herein described, by way of example only, with reference to the accompanying drawings, wherein:

FIGS. 1–3 are schematic cross-sectional views of a printed circuit board base material according to the present invention;

FIG. 4 is schematic cross-sectional view of a multilayer printed circuit board base material according to the present invention; and FIG. 5 is a schematic cross-sectional view of mechanically and electrically uninterruptedly connected rigid and flexible regions in a printed circuit board base material according to the present invention.

DESCRIPTION OF THE PREFERRED EMBODIMENTS

The present invention is of a printed circuit board (PCB) base material which can be used for manufacturing PCBs, antennas and similar products featuring intimately bonded dielectric and electroconductive layers. Specifically, the present invention can be used to enable transmission of high frequency electromagnetic signals with short signal transmission delay times, and, at the same time, to provide PCBs, antennas and the like with desired mechanical properties, such as rigidity and/or flexibility.

The principles and operation of the present invention may be better understood with reference to the drawings and accompanying descriptions.

Referring now to FIGS. 1–3 presented are few embodiments of a printed circuit board (PCB) base material 10 according to the present invention. PCB base material 10 includes a dielectric layer made of UHMWPE composite 12. According to a preferred embodiment of the invention UHMWPE composite 12 may, for example, be one or any combination of the following composites:

(a) a network of UHMWPE chopped and randomly arranged (non woven) fibers held together by self-bonding properties of the fibers and/or by a UHMWPE resin adhesive matrix 14 attached thereto;

(b) one or more unidirectional layers of UHMWPE fibers held together by self-bonding and/or by a UHMWPE resin adhesive matrix; and (c) one or more layers of UHMWPE fibers cloth, the fibers thereof being held together by self-bonding and/or by a UHMWPE resin adhesive matrix.

Thus, according to the present invention adherence among UHMWPE fibers is achieved by at least one of two ways: (i) fiber self-bonding which takes place under appropriate conditions, such as the apt temperature and pressure applied to the fibers and appropriate preliminary fiber treatment, all as further detailed in the Example section below; and (ii) holding the fibers together by a UHMWPE adhesive matrix 14 in a preform of powder, gel or crystal mats precipitated from proper volatile solutions.

Further according to the present invention adhesion of an electroconductive material layer 16, such as, but not limited to, copper foil, silver foil, gold foil, electroconductive polymer sheet, etc., or UHMWPE matrix layer 14 to a surface of UHMWPE composite 12 is effected by providing the surface of UHMWPE composite 12 with a branched brush structure 18.

Providing the surface of UHMWPE composite 12 with a branched brush structure 18 may be preferably effected via an abrasion (roughing) treatment, which results in exposed free ends of broken UHMWPE fibrils anchored at their other end to the mass of UHMWPE composite 12. Depending on the application, this becomes possible due to the internal fibrillar structure of the UHMWPE fibers and/or due to the intertwined structure of the UHMWPE cloth, if the latter is employed.

However, according to another embodiment of the present invention bonding UHMWPE composite 12 and electroconductive layer 16 may alternatively be effected by gluing the layers with a polar glue, such as, but not limited to, epoxy resin, polyethers, etc. To this end UHMWPE composite 12 is first treated by chemical or plasma surface treatment, thereby encouraging the polar glue to interpenetrate into and chemically interact with the treated surface of UHMWPE composite 12.

According to still another embodiment of the present invention bonding UHMWPE composite 12 and electroconductive layer 16 may alternatively be effected by coating the roughed UHMWPE surface 18 and/or the electroconductive layer 16 (as shown in FIG. 3) by a suitable mat, powder or gel 14, e.g., UHMWPE reactor powder, UHMWPE gel, or UHMWPE mat, followed by melting all layers together under applied pressure. Alternatively or in addition, bonding may be effected via recrystallization of partly dissolved ultrahigh molecular weight polyethylene fibers of composite 12 itself.

A UHMWPE mat can be preprepared as an independent article or be formed directly on the appropriate surfaces of either the composite or the electroconductive foil by precipitation from volatile solvents (e.g. xylene, decaline, tetraline etc.) based UHMWPE solutions.

Because of the unusual difference between thermal expansion coefficients of UHMWPE fibers ($-22.0 \cdot 10^{-6}$ C.-1) and the UHMWPE bulk matrix ($+200.0 \cdot 10^{-6}$ C.-1), it is possible, by controlling of the fiber/matrix ratio within the composite, to manufacture composites which possess predetermined thermal expansion properties, and in particular, thermal expansion which substantially equals zero.

Thus, the combination of oriented UHMWPE fibers having negative CTE with UHMWPE matrix having positive CTE may allow the coefficient of thermal expansion (CTE) to match those of the conducting or semiconducting materials or elements attached to the UHMWPE composites.

As shown in FIG. 4, because of the high adhesion properties of the UHMWPE composite 12 a self-bonded multilayer printed circuit board (MPCB) base material can be readily manufactured. Thus, further according to the present invention a MPCB base material is provided. The MPCB includes a plurality of individual PCBs (for example as shown in FIG. 2) laminated together. Each individual PCB may be further separated from an adjacent individual PCB by an additional layer of UHMWPE matrix resin (e.g., mats 14) which serves for enhanced adhesiveness of the multiple boards. The adhesive UHMWPE matrix resin may possess a form of a layer or a form of discrete dots 22.

Because of the relative lower rigidity of the adhesive, the interlayer thermal expansion stresses caused by Z-axis expansion of individual PCB sheets is decreased, thereby the effect of an interlayer copper "barrel" 20 fracturing into the multilayer boards is minimized.

As shown in FIG. 5, a PCB according to the present invention can be manufactured in a rigid form, a flexible form or in a combined form including both flexible and rigid regions. The rigidity (or flexibility) of the UHMWPE composite and the PCB base material according to the present invention can be tailored by controlling the ratio between UHMWPE fibers and UHMWPE matrix in the UHMWPE composite. Controlling the ratio between UHMWPE fibers and UHMWPE matrix in the UHMWPE composite can be effected by, for example, controlling the fibers density in the non-woven, unidirectional or cloth UHMWPE composites. Different fiber densities may be applied to different regions of the UHMWPE composite, resulting in different rigidity of the regions.

Alternatively, the rigidity (or flexibility) of the composite or PCB base material according to the present invention can be tailored by thermal melting of UHMWPE fibers present in desired regions of the composite or PCB base material. Melting causes a significant increase in the flexibility of the composite and as a direct result, a significant increase in the flexibility of the material. A melted region is indicated in FIG. 5 by 14'.

Still alternatively, the rigidity (or flexibility) of the PCB according to the present invention can be tailored by controlling the thickness of the UHMWPE composite in desired regions of the base material, wherein decreased thickness increases flexibility.

Thus, according to the present invention a UHMWPE composite is provided which includes adhered UHMWPE fibers. The composite preferably further includes a UHMWPE matrix for effecting the adherence of the fibers together.

Further provided is a printed circuit board or antenna base material which includes a dielectric layer including a fiber network of UHMWPE composite, and an electroconductive material laminated on at least one side of the dielectric layer.

Sheets of UHMWPE PCB base material can be laminated (bonded) together to form a multilayer printed circuit board, characterized by decreased electroconductive layers fracturing induced by thermal expansion.

Because of the unusual difference between thermal expansion coefficients of the UHMWPE fibers ($-22 \cdot 10^{-6\circ}$ C.$^{-1}$) and UHMWPE matrix ($+200 \cdot 10^{-6\circ}$ C.$^{-1}$), it is possible, by controlling the UHMWPE fiber/matrix ratio, to manufacture a composite possessing selected thermal expansion properties (e.g., substantially zero). One ordinarily skilled in the art would know how to conduct experimentation to determine the desired ratio between fibers and matrix UHMWPE in the composite to obtain any desired thermal expansion capability.

A printed circuit board base material that includes the UHMWPE composite can be manufactured both in rigid and flexible forms, or in any continuous combinations of mechanically and electrically uninterruptedly connected rigid and flexible regions.

High adhesion of electroconductive material layers (for example, copper foil, silver, gold, electroconductive polymer sheet, etc.) to the surface of the UHMWPE composite is achieved by creating a branched brush layer structure on the surface of the composite, with or without further chemical surface modification and interpenetration and interaction of an adhesive polar glue.

The inherent electrical properties of UHMWPE make it very suitable for electromagnetic applications such as, but not limited to, PCBs, antennas and the like. The combination of a low dielectric constant ($\epsilon$), low dissipation factor (tan $\delta$) and superior strength of UHMWPE results in excellent mechanical properties without diminution of desired electromagnetic properties.

The UHMWPE polymer properties can also provide a natural shield against harsh environmental condition without affecting the electrical properties. The high hydrophobicity of UHMWPE sustains the reported electrical properties even under wet environments.

The matrix selection in the UHMWPE based composites is critical in order to preserve not only the composite structural properties (such as strength, thermal expansion, etc.) but also the loss tangent (tan $\delta$=0.0002) and dielectric constant ($\epsilon$=2.2).

Standard matrix resins (at volume contents of 20–50% in composite), such as epoxy resin ($\epsilon$=3.2; tan $\delta$=0.02), cyanate ester ($\epsilon$=3.0; tan $\delta$=0.0076), polyethyleneterephthalate ($\epsilon$=2.7; tan $\delta$=0.034), kraton ($\epsilon$=3.15; tan $\delta$=0.011), yield inferior electrical properties. On the other hand, by using UHMWPE matrix ($\epsilon$=2.2; tan $\delta$=0.0002), or UHMWPE foam substrate ($\epsilon$=1.3; tan $\delta$=0.001), the electric properties of the composite can be further enhanced.

It has been shown that ultrahigh molecular weight polyethylene fiber based PCB and antenna materials have suitable dielectric properties for microwave applications. Ultrahigh molecular weight polyethylene fiber also has superior mechanical strength properties. For many microwave applications, however, superior mechanical strength is not critical. The production of ultrahigh molecular weight polyethylene fiber is relatively complicated: the material is produced from solution and requires the presence of organic solvents. The production process is also non-trivial from the standpoints of both safety and ecology.

It has been discovered that common polyolefin fibers can replace, fully or partially, ultrahigh molecular weight polyethylene fiber. While the mechanical properties are less good, the strength characteristics are sufficient for many microwave applications, and the cost of such fibers is as little as 20–50% of ultrahigh molecular weight polyethylene fiber.

The thermal expansion coefficient of the dielectric material is of particular importance for PCB and antenna applications because the material must work together with various other materials, e.g. copper or ceramics, without rupturing of the layers or chips. For this reason, the polyolefins, like UHMWPE, should be used in oriented and non-oriented forms such that the thermal expansion coefficient can be controlled by the ratio of oriented phase to non-oriented phase.

Hence, further provided is a printed circuit board or antenna base material which includes at least one dielectric layer including a composite which includes a polyolefin and at least one electroconductive layer including an electroconductive material said dielectric and electroconductive layers being intimately bonded to one another. In a preferred embodiment, the polyolefin is selected from the group consisting of UHMWPE, high-density polyethylene, low-density polyethylene, and combinations thereof.

In another preferred embodiment, the electroconductive material is selected from the group consisting of a copper foil, a silver foil, a gold foil and an electroconductive polymer sheet.

In another preferred embodiment, a surface of each of the dielectric layers, the surface facing one of the conductive layers, includes exposed free ends of broken polyolefin fibrils. This is preferably effected by abrasion treatment applied to the surface.

In yet another preferred embodiment, the dielectric layers and the electroconductive layers are bonded together by a polar glue.

In a preferred embodiment, the one or more dielectric layers and the one or more electroconductive layers are bonded together by a non-polar substance. The non-polar substance is preferably selected from the group consisting of ultrahigh molecular weight polyethylene, high density polyethylene, low density polyethylene, and combinations thereof. The form of the non-polar substance is preferably selected from the group consisting of powders, gels, mats, films, fibers, tapes, fabrics, and combinations thereof.

In another preferred embodiment, said composite includes a polyolefin preferably selected from the group consisting of UHMWPE, high density polyethylene, low density polyethylene, and combinations thereof, wherein said polyolefin possesses an oriented structure, at least one electroconductive layer including an electroconductive material, said dielectric and electroconductive layers being intimately bonded to one another.

In another preferred embodiment, the reinforcement components of said polyolefin composite are in oriented form and are selected from the group consisting of fibers, films, tapes, monofilaments, rods, whiskers and combinations thereof, and wherein said films, tapes, monofilaments, rods, whiskers etc. are in continuous and/or in chopped form. The reinforcement components of the composite can be distributed randomly, in ordered layers or regions, or in combinations thereof.

In yet another preferred embodiment, the composite material according to the present invention further includes a matrix that includes a polyolefin. The polyolefin included in the matrix is preferably selected from the group consisting of UHMWPE, high-density polyethylene, low-density polyethylene, and combinations thereof for holding the fibers together. The polyolefin matrix can be distributed randomly, in ordered layers or regions, or in combinations thereof, within the volume of the composite base material. In another preferred embodiment, the polyolefin matrix for holding together said reinforcement components is of the form selected from the group consisting of powders, gels, mats, films, fibers, tapes, fabrics, and combinations thereof.

In another preferred embodiment, said reinforcement components are selected from the group consisting of ultrahigh molecular weight polyethylene, high density polyethylene, low density polyethylene, and combinations thereof.

In another preferred embodiment, the base material is attached to at least one material selected from the group of conducting and semi-conducting materials, and has thermal expansion properties that are tailored, as described above, to be substantially equal in all directions (X, Y, and Z) to those of said attached materials. Thus for ceramic components, the thermal expansion is substantially zero in all directions; for a copper layer, the thermal expansion is about $17 \times 10^{-6}$ C$^{-1}$.

EXAMPLES

Reference is now made to the following examples, which together with the above descriptions illustrate the invention in a non-limiting fashion.

Example 1

A commercial yarn of ultra-high molecular weight polyethylene (SPECTRA 1000) having a tensile strength of 33 g/denier was wound around a steel frame at a force of 0.2 kg. The wound yarn was soaked in a solution of paraffin oil containing 0.1% by weight UHMWPE having a similar yarn molecular weight. Soaking was for two minutes at 150° C. The yarn was then cooled slowly to room temperature. Excess paraffin oil was removed by soaking in hexane bath and the yarn was dried under vacuum. Then, unidirectional yarn layers were removed from the steel frame and were compressed. Two unidirectional layers were mounted one on top of the other, such that their fibers were perpendicularly arranged, forming a cross-ply structure.

A xylene solution containing 1% by weight UHMWPE having a similar yarn molecular weight was prepared, heated to 120° C. and cooled to room temperature to form a UHMWPE gel.

The UHMWPE gel was applied by molding at 180° C. onto a preroughened surface of copper based electroconductive foil, 38 µm in thickness. Excess xylene was removed by vacuum. The copper foil now supplemented with UHMWPE layer was stuck onto the cross-ply structure by compression (20 MPa, 151° C., 10 minutes). The resulting PCB base material was then cooled to room temperature.

Thickness of the PCB base material thus obtained was 0.2 mm. The degree of adhesion between the copper foil and the UHMWPE composite was determined by a peel test to be 9 LB/inch.

Example 2

A commercial yarn of ultra-high molecular weight polyethylene substantially containing 0.1% by weight UHMWPE having a similar yarn molecular weight. Soaking was for two minutes at 150° C. The yarn was then cooled slowly to room temperature. Excess paraffin oil was removed by soaking in hexane bath and the yarn was dried under vacuum. Then, unidirectional yarn layers thus obtained were removed from the steel frame and were compressed. Two unidirectional layers were mounted one on top of the other, such that their fibers were perpendicularly arranged, forming a cross-ply structure.

A xylene solution containing 1% by weight UHMWPE having a similar yam molecular weight was prepared, heated to 120° C. and cooled to room temperature to form a UHMWPE gel.

The UHMWPE gel was applied by molding at 180° C. onto a preroughened surface of copper based electroconductive foil, 38 µm in thickness. Excess xylene was removed by vacuum. The copper foil, now supplemented with a UHMWPE layer, was stuck onto the cross-ply structure by compression (20 MPa, 151° C., 10 minutes). The resulting PCB base material was then cooled to room temperature.

The thickness of the PCB base material thus obtained was 0.2 mm. The degree of adhesion between the copper foil and the UHMWPE composite was determined by a peel test to be 9 LB/inch.

Example 3

A commercial yam of ultra-high molecular weight polyethylene substantially solution of paraffin oil containing 0.1% by weight UHMWPE having a similar yarn molecular weight. Soaking was for two minutes at 150° C. The yarn was cooled slowly to room temperature. Excess paraffin oil was removed by soaking in a hexane bath and the yarn was dried under vacuum. Then unidirectional yarn layers were removed from the steel frame and were compressed. Two unidirectional layers were mounted one on top of the other, such that their fibers were perpendicularly arranged, forming a cross-ply structure.

UHMWPE powder with average molecular weight 3,000,000 was molded at 190° C. onto a preroughened surface of a copper based electroconductive foil, 38 µm in thickness, forming a thin layer of UHMWPE on the foil.

The copper foil, now supplemented with UHMWPE layer, was stuck onto the cross-ply structure by compression (20 MPa, 151° C., 10 minutes). The resulting PCB base material was then cooled to room temperature.

The thickness of the PCB base material thus obtained was 0.2 mm. The degree of adhesion between the copper foil and the UHMWPE composite was determined by a peel test to be 9 LB/inch.

Example 4

A UHMWPE gel prepared essentially as described under Example 1 above was applied by molding to both sides of several preroughened surfaces of copper based electroconductive foils, 38 µm in thickness, forming thin layers of UHMWPE on both sides thereof. Similarly, two single side UHMWPE coated foils were also prepared and the foils were packed together between the single side coated foils. The packed foils were compressed (20 MPa, 151° C., 10 minutes) and the resulting PCB base material was then cooled to room temperature. A 2 mm multilayer PCB base material was obtained.

Example 5

A commercial yarn of ultra-high molecular weight polyethylene (DYNEEMA SK 76, 1760 dtex) was wound around a steel frame at a force of 0.2 kg. The wound yarn was soaked in a solution of paraffin oil containing 0.1% by weight UHMWPE having a similar yarn molecular weight. Soaking was for two minutes at 150° C. The yarn was cooled slowly to room temperature. Excess paraffin oil was removed by soaking in a hexane bath and the yarn was dried under vacuum. Then, unidirectional yarn layers were removed from the steel frame and were compressed. Two unidirectional layers were mounted one on top of the other, such that their fibers were perpendicularly arranged, forming a cross-ply structure.

The surface of the structure was roughened by abrasive material and chemically treated in an acid solution containing (by weight) 7 parts of $K_2Cr_2O_7$; 150 parts of concentrated $H_2SO_4$; and 12 parts of $H_2O$, for 30 minutes at 60° C. Immediately following the acid treatment, the structure was washed in running water for 2 hours and dried overnight under ambient conditions.

A thin layer of Epoxy ARALDITE (50% hardener and 50% resin) was applied onto a preroughened surface of a copper foil and to the chemically treated UHMWPE structure. The foil and the structure were compressed together (10 MPa, 80° C., 20 minutes).

The thickness of the PCB thus obtained was about 0.2 mm. The degree of adhesion between the copper foil and the UHMWPE composite was determined by a peel test to be 10 LB/inch.

Example 6

A commercial yarn of ultra-high molecular weight polyethylene substantially containing 0.1% by weight UHMWPE having a similar yarn molecular weight. Soaking was for two minutes at 150° C. The yarn was cooled slowly to room temperature. Excess paraffin oil was removed by soaking in a hexane bath and the yarn was dried under vacuum. Then unidirectional yarn layers were removed from the steel frame and were compressed. Two unidirectional layers were mounted one on top of the other, such that their fibers were perpendicularly arranged, forming a crossply structure.

A 0.2 mm sheet of UHMWPE matrix was applied onto this structure. substantially the sheet and all elements were compressed together (10 MPa, 151° C., 10 minutes) to form a rigid PCB base material.

Example 7

High-density polyethylene powder was heated at 180° C. and extruded through a slit with dimensions of 0.3 mm by 5 mm. The extruded tape was stretched to seven times the original length and wound on a steel frame to produce perpendicular layers. The wound tape was then compressed at 20 MPa and 132° C. for 20 minutes. Copper foil was first bonded to high-density polyethylene film at 180° C. and 20 MPa and was subsequently bound to the wound-tape construction at 25 MPa and 132° C. for 15 minutes.

PCB with copper foil and with a thickness of 1.6 mm was obtained from the above procedure. The PCB sheet obtained has superior electrical properties and exhibits a suitable CTE between −50° C. and +80° C.

While the invention has been described with respect to a limited number of embodiments, it will be appreciated that many variations, modifications and other applications of the invention may be made.

What is claimed is:

1. A base material for the production of printed circuit boards and antennas, the base material comprising at least one dielectric layer including a polyolefin composite and at least one electroconductive layer including an electroconductive material, said dielectric and electroconductive layers being intimately bonded to one another.

2. The base material of claim 1, wherein said polyolefin composite is selected from the group consisting of ultrahigh molecular weight polyethylene, high density polyethylene, low density polyethylene, and combinations thereof.

3. The base material of claim 2, wherein said polyolefin composite includes oriented reinforcement components selected from the group consisting of fibers, films, tapes, monofilaments, rods, whiskers and combinations thereof.

4. The base material of claim 3, wherein said oriented reinforcement components selected from said group consisting of fibers, films, tapes, monofilaments, rods, and whiskers are of a form selected from the group consisting of chopped form, continuous form, and combinations thereof.

5. The base material of claim 4, wherein said reinforcement components are distributed in a distribution selected from the group consisting of ordered layers, ordered regions, random distribution, and combinations thereof.

6. The base material of claim 3, wherein said polyolefin composite includes a polyolefin matrix for holding together said reinforcement components.

7. The base material of claim 6, wherein said reinforcement components are selected from the group consisting of ultrahigh molecular weight polyethylene, high density polyethylene, low density polyethylene, and combinations thereof.

8. The base material of claim 6, wherein said polyolefin matrix for holding together said reinforcement components is selected from the group consisting of ultrahigh molecular weight polyethylene, high density polyethylene, low density polyethylene, and combinations thereof, and wherein said polyolefin matrix is distributed within said polyolefin composite in a distribution selected from the group consisting of ordered layers, ordered regions, random distribution, and combinations thereof.

9. The base material of claim 8, wherein said polyolefin matrix for holding together said oriented reinforcement components is of the form selected from the group consisting of powders, gels, mats, films, fibers, tapes, fabrics, and combinations thereof.

10. The base material of claim 1, wherein said electroconductive material is selected from the group consisting of a copper foil, a silver foil, a gold foil and an electroconductive polymer sheet.

11. The base material of claim 1, wherein a surface of each of said at least one dielectric layers, said surface facing one of said at least one conductive layers, includes exposed free ends of broken polyolefin fibrils.

12. The base material of claim 1, wherein said at least one dielectric layers and said at least one electroconductive layer are bonded together by a polar glue.

13. The base material of claim 8, wherein said base material is attached to at least one material selected from the group of conducting and semi-conducting materials, and wherein said base material has thermal expansion properties that are tailored to be substantially equal in all directions to those of said attached materials.

14. The base material of claim 1, wherein said at least one dielectric layer and said at least one electroconductive layer are bonded together by a non-polar substance.

15. The base material of claim 14, wherein said non-polar substance is selected from the group consisting of ultrahigh molecular weight polyethylene, high density polyethylene, low density polyethylene, and combinations thereof.

16. The base material of claim 15, wherein said non-polar substance is of the form selected from the group consisting of powders, gels, mats, films, fibers, tapes, fabrics, and combinations thereof.

* * * * *